(12) United States Patent
Hwang

(10) Patent No.: US 6,424,193 B1
(45) Date of Patent: Jul. 23, 2002

(54) CIRCUIT FOR SYNCHRONIZING FREQUENCIES OF CLOCK SIGNALS

(75) Inventor: Sung-Sik Hwang, Yongin-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/897,582

(22) Filed: Jun. 29, 2001

(30) Foreign Application Priority Data

Aug. 7, 2000 (KR) ........................................ 2000-45686

(51) Int. Cl.$^7$ ................................................ H03L 7/08
(52) U.S. Cl. ........................ 327/158; 327/115; 327/116
(58) Field of Search ................................. 327/156, 157, 327/158, 115, 116, 151, 160

(56) References Cited

U.S. PATENT DOCUMENTS

| | | | | |
|---|---|---|---|---|
| 4,868,514 A | * | 9/1989 | Azevedo et al. | 327/158 |
| 5,088,080 A | * | 2/1992 | Ishibashi et al. | 369/48 |
| 6,049,238 A | * | 4/2000 | Shimizu et al. | 327/156 |

* cited by examiner

Primary Examiner—Dinh T. Le
(74) Attorney, Agent, or Firm—Mills & Onello LLP

(57) ABSTRACT

A phase-locked loop (PLL) circuit delays an input clock signal having a first frequency and generates a feedback signal to be delayed with respect to the input clock signal by one cycle. After synchronizing phases of the input clock signal and the feedback signal, a phase comparator compares the phase of the input clock signal with a phase of a reference clock signal having a second frequency, and generates a differential signal corresponding to the phase difference. A counter counts up or down in response to the differential signal. A decoder generates control signals from counting data. A voltage controlled delay line (VCDL) generates an output clock signal by delaying the input clock signal while the control signals are activated. When the phases of the input clock signal and the reference clock signal coincide with each other, the output clock signal from the VCDL has the same frequency with the input clock signal and is synchronized with the reference clock signal. Hence, frequencies of the first clock signal and the reference clock signal can be synchronized with each other by the PLL circuit operation.

19 Claims, 13 Drawing Sheets

CIRCUIT FOR SYNCHRONIZING FREQUENCIES OF CLOCK SIGNALS

This application relies for priority upon Korean Patent Application No. 2000-45686, filed on Aug. 7, 2000, the contents of which are herein incorporated by reference in their entirety.

FIELD OF THE INVENTION

The present invention relates to a circuit for synchronizing frequencies of two clock signals, and more particularly to a phase-locked loop (PLL) circuit synchronizing an input clock signal having a first frequency with a reference clock signal having a second frequency.

BACKGROUND OF THE INVENTION

With the rapid advances in CMOS process technology, computers with clock frequencies of more 100 MHz are widely used. Even though clock skew has not been an important issue in conventional low-speed synchronization systems, the reduction of the clock skew has become a primary requirement as system clock speed is being increased.

Many clock de-skews or clock synchronization methods have been developed to reduce the clock skew or to avoid system malfunction. Some of these methods are disclosed in "A Dynamic Clock Synchronization Technique for Large Systems" (D. E. Brueske and S. H. K. Embabi, IEEE Trans. On Components, Packaging, and Manufacturing Technology, Part B, vol. 17, no.3 pp. 350–361) and "Low-power Clock Deskew Buffer for High-speed Digital Circuits" (S. I. Liu, IEEE j. Solid-State Circuits, vol. 34, no. 4, pp. 554–558, April 1999), etc. These efforts were, however, focused on the synchronization or de-skew between the same frequencies.

Therefore, there exists a need for systems and methods that can synchronize clock signals of different frequencies.

SUMMARY OF THE INVENTION

The object of the present invention is to provide a circuit and method for synchronizing an input clock signal having a first frequency with a reference clock signal having a second frequency.

According to one aspect of the present invention, the PLL circuit includes a first phase comparator circuit for comparing phases of a first (input) clock signal having a first frequency and a feedback signal and for generating a control voltage corresponding to a phase difference between the first clock signal and the feedback signal. A second phase comparator circuit compares phases of a second (reference) clock signal having a second frequency and an output clock signal and for generating a differential signal indicative of a phase difference between the reference clock signal and an output clock signal. A counter counts data in response to the differential signal of the second phase comparator circuit. The PLL circuit further includes a decoder for generating N bit switching control signals by decoding the counting data from the counter. A voltage-controlled delay line (VCDL) generates a feedback signal in response to the first clock signal after the input clock signal is delayed while the control voltage is applied to the VCDL. The VCDL includes N delay stages which are connected in series corresponding to each bit of the switching control signals and generates the output clock signal in response to a signal from the one of delay stages corresponding to the third switching control signals.

According to another aspect of the present invention, a method is provided for a PLL circuit to allow synchronizing a first (input clock) signal having a first frequency with a second (reference) clock signal having a second frequency. In accordance with the method. A feedback signal which is delayed with respect to the input clock signal by one cycle is generated by delaying the input clock signal. The phases of the input clock signal and the reference clock signal are compared. A differential signal corresponding to a phase difference when the phases of the input clock signal and the reference clock signal are not identical with each other is generated. Data is counted up or down in response to the differential signal. Control signals from the counting data are decoded, and an output clock signal is provided by delaying the input clock signal while the control signals are activated. The method is carried out repeatedly until the phases of the input clock signal and the reference clock signal are identical to each other.

In a preferred embodiment of the present invention, generating the feedback signal includes receiving the input clock signal, comparing phases of the input clock signal and the feedback signal, generating a differential signal when the phases of the input clock signal and the feedback signal are not identical with each other, generating a control voltage corresponding to the differential signal, and generating the feedback signal by delaying the input clock signal while the control voltage is applied to the VCDL. The steps are repeated until the phases of the input clock signal and the feedback signal are identical to each other.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
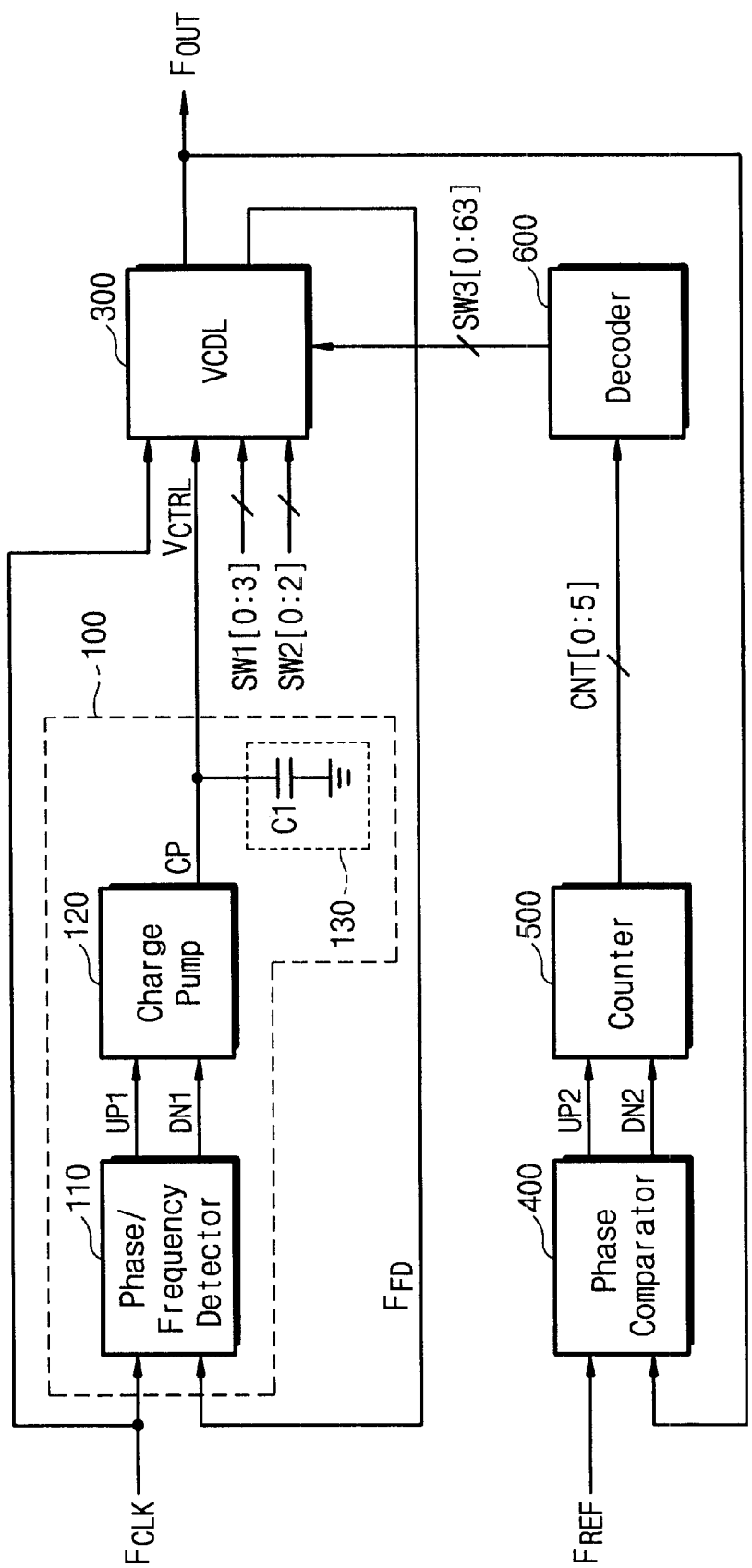
FIG. 1 is a circuit diagram showing a phase locked loop (PLL) circuit in accordance with an embodiment of the present invention.

Referring now to FIGS. 1 to 12C, an embodiment of the present invention will be described. FIG. 1 is a block diagram showing a configuration of a PLL circuit in accordance with an embodiment of the present invention. The PLL circuit 10 includes an analog phase comparator 100, a VCDL 300, a phase comparator 400, a counter 500, and a decoder 600.

The analog phase comparator 100 includes a phase/frequency detector 110, a charge pump 120, and a loop filter 130. The phase/frequency detector 110 compares a phase of an input clock signal $F_{CLK}$ from an external source with a phase of a feedback signal $F_{FD}$ from the VCDL 300, and then generates a first up-counting signal UP1 and a first down-counting signal DN1 corresponding to the phase difference. In this embodiment, the phase/frequency detector 110 generates the UP1 signal when the phase of the $F_{CLK}$ is earlier than that of the $F_{FD}$, and generates the DN1 when the phase of the $F_{CLK}$ is later than that of the $F_{FD}$. The charge pump 120 generates a charge pump signal CP in response to the UP1 and the DN1 signals from the phase/frequency detector 110. Further, the loop filter 130 generates a control voltage $V_{CTRL}$ in response to the charge pump signal CP from the charge pump 120. The loop filter 130 is composed of a capacitor C1 connected between an output terminal of the charge pump 120 and a ground voltage.

The phase comparator 400 compares a phase of a reference clock signal $F_{REF}$ with a phase of an output clock signal $F_{OUT}$ from the VCDL 300, and then generates a second up-counting signal UP2 and a second down-counting signal DN2 corresponding to a phase difference between the two signals, $F_{REF}$ and $F_{OUT}$.

The counter 500 counts up or down by one bit in response to the UP2 and the DN2 signals provided from the phase comparator 400, and then generates 6-bit counting signals CNT[0:5]. The decoder 600 generates 64-bit third switching control signals SW3[0:63] by decoding the CNT[0:5] generated from the counter 500.

The VCDL 300 generates the feedback signal $F_{FD}$ by delaying the input clock signal $F_{CLK}$ while the control voltage $V_{CTRL}$ is applied to the VCDL, and also generates the output clock signal $F_{OUT}$ in response to the SW3[0:63] signals generated from the decoder 600.

Figure 2:
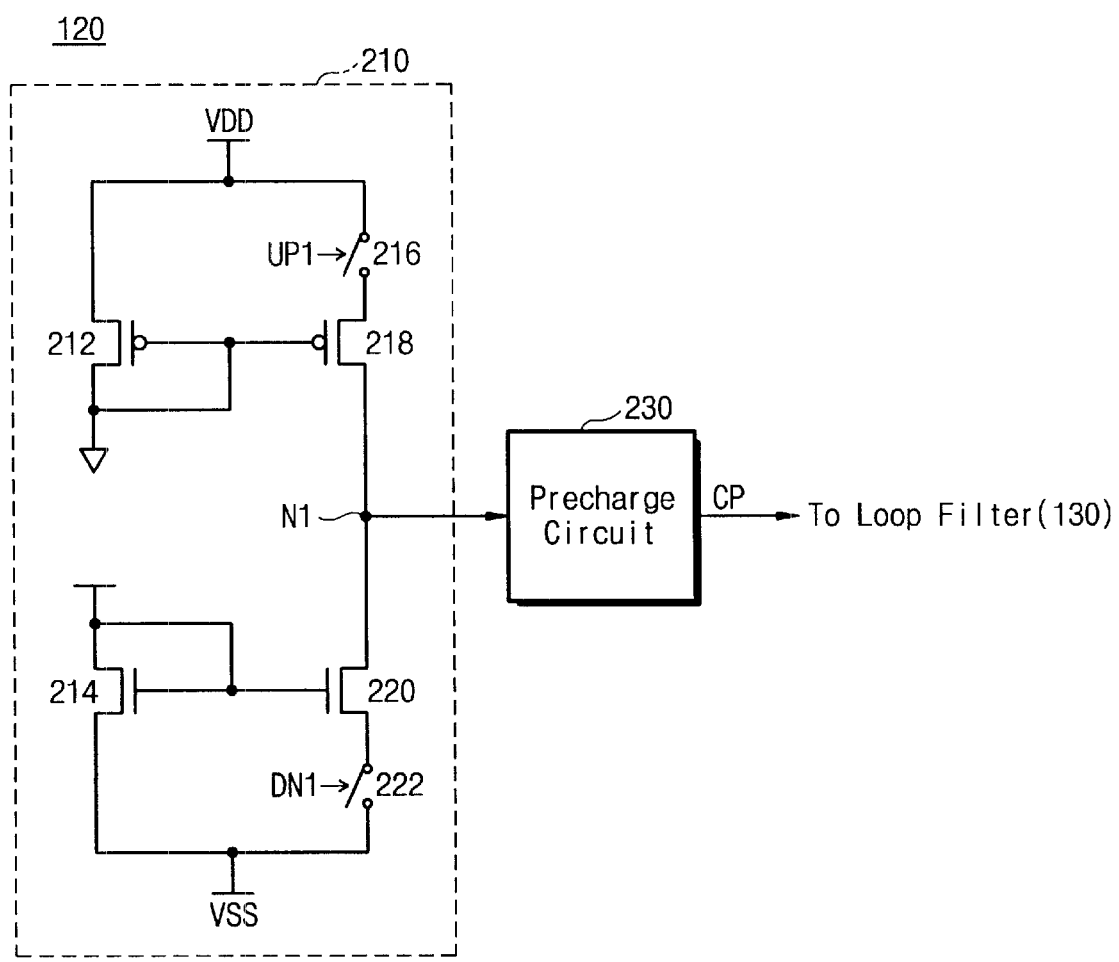
FIG. 2 is a detailed circuit diagram of one embodiment of the charge pump shown in FIG. 1.

Referring to FIGS. 2-8, a detailed circuit configuration and operation of FIG. 1 will be described. FIG. 2 is a detailed circuit diagram showing the charge pump of FIG. 1. The charge pump 120 has a charge pump circuit 210 and a precharge circuit 230 for precharging a capacitor C1 of the loop filter 130. The charge pump circuit 210 includes PMOS transistors 212 and 218, NMOS transistors 214 and 220, and switches 216 and 222.

The PMOS transistor 212 has a current path formed between a power supply voltage VDD and a ground voltage VSS, and has a gate connected to the VSS. The PMOS transistor 218 has a current path formed between one end of the switch 216 and first node N1 and has a gate connected to the VSS.

The NMOS transistor 214 has a current path formed between the VDD and the VSS and has a gate connected to the VDD. The NMOS transistor 220 has a current path formed between the first node N1 and one end of the switch 222 and has a gate connected the VDD.

The switch 216 is connected between the power supply voltage VDD and source of the PMOS transistor 218 and is turned on or off by a first up-counting signal UP1 from the phase/frequency detector 110. The switch 222 is connected between a drain of the NMOS transistor 220 and the ground voltage VSS and is turned on or off by a first down-counting signal DN1 from the phase/frequency detector 110. When a phase of the input clock signal $F_{CLK}$ is earlier than that of the feedback signal $F_{FD}$, the switch 216 is turned on by UPI and the node N1 is charged up to the VDD level. On the contrary, when the phase of the $F_{CLK}$ is later than that of the $F_{FD}$, the switch 222 is turned on by DN1 and the node N1 is discharged to the VSS level. In this embodiment, the switches 216 and 222 are formed of NMOS transistors, and connect dummy transistors between drain and source terminals of switching transistors so as to prevent noise due to charge injection when transistors are turned on and off.

Figure 3:
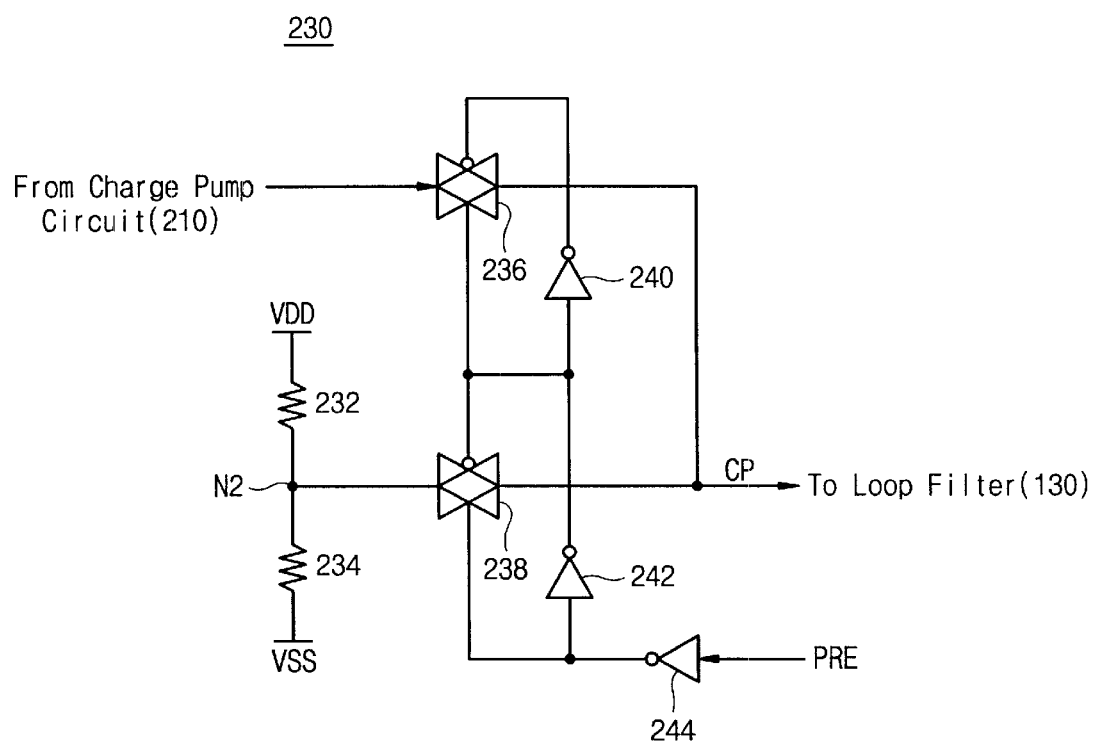
FIG. 3 is a detailed circuit diagram of one embodiment of the precharge circuit of FIG. 2.

FIG. 3 is a detailed circuit diagram showing one embodiment of a precharge circuit 230 of FIG. 2. The precharge circuit 230 includes resistors 232 and 234, transmission gates 236 and 238, and inverters 240, 242, and 244. The resistors 232 and 234 are connected between the power supply voltage VDD and the ground voltage VSS in series and thereby the VDD is divided.

When the system is powered up, a low-leveled precharge control signal PRE is provided from an external source. Accordingly, an electric charge of a second node N2 is divided by the resistors 232 and 234 and is provided to the loop filter 130 through the transmission gate 238, and thereby the capacitor C1 of the loop filter 130 is precharged to a certain level. In a certain period of time after a power-up, PRE is transitioned to a high level. Then, a current path formed between the second node N2 and the loop filter 130 is cut off, and thereby a current path is formed between the first node N1 of charge pump circuit 210 and the loop filter 130 through the transmission gate 236. Therefore, a charge pump signal CP from the charge pump circuit 210 is provided to the loop filter 130. Thus, when the system is powered up, the PLL circuit 10 ensures stable operations by precharging the capacitor C1 of the loop filter 130 to a certain level.

Figure 4:
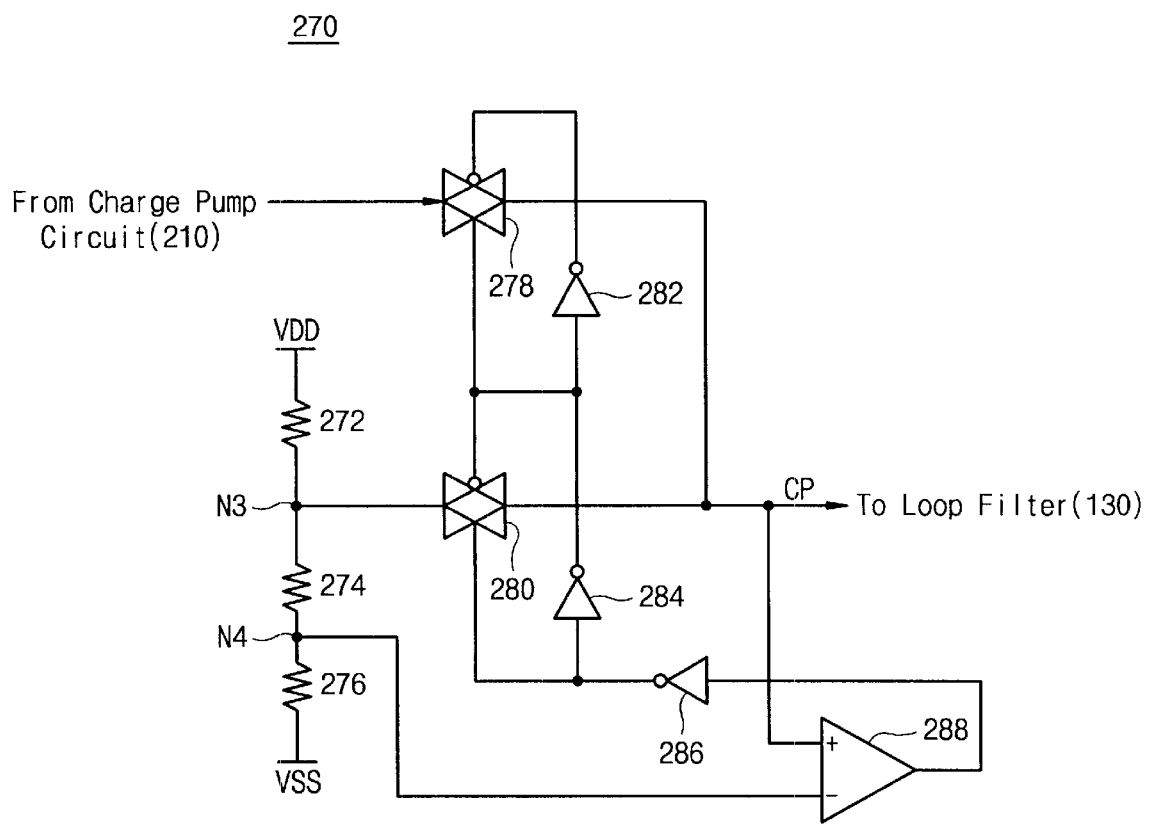
FIG. 4 is a detailed circuit diagram of another embodiment of the precharge circuit of FIG. 2.

FIG. 4 is a circuit diagram showing another embodiment of the precharge circuit of FIG. 2. While the precharge circuit 230 of FIG. 3 performs a precharge operation in response to the precharge control signal PRE from external sources, a precharge circuit 270 of FIG. 4 performs the precharge operation in accordance with a result of a differential amplifier 288 acting as a comparator. The precharge circuit 270 is composed of resistors 272, 274, and 276 connected sequentially between the power supply voltage VDD and the ground voltage VSS in series, transmission gates 278 and 280, inverters 282, 284, and 286, and the differential amplifier 288. When a current path is not formed between the transmission gates 278 and 280 yet, an electric potential of an inverted input terminal (−) in the differential amplifier 288 is higher than that of a non-inverted input terminal (+). Therefore, the differential amplifier 288 generates a low-leveled signal, thereby a charge of third node N3 is provided to the capacitor C1 of the loop filter 130 through the transmission gate 280, and then the C1 is precharged to a certain level.

After a predetermined period of time, if the potential of the third node N3 becomes higher than that of a fourth node N4, the differential amplifier 288 generates a high-leveled signal. The signal passes through the transmission gate 278, thereby a current path is formed between the first node N1 of the charge pump circuit 210 and the loop filter 130, and then the charge pump signal CP is provided to the loop filter 130 from the charge pump circuit 210.

Figure 10:
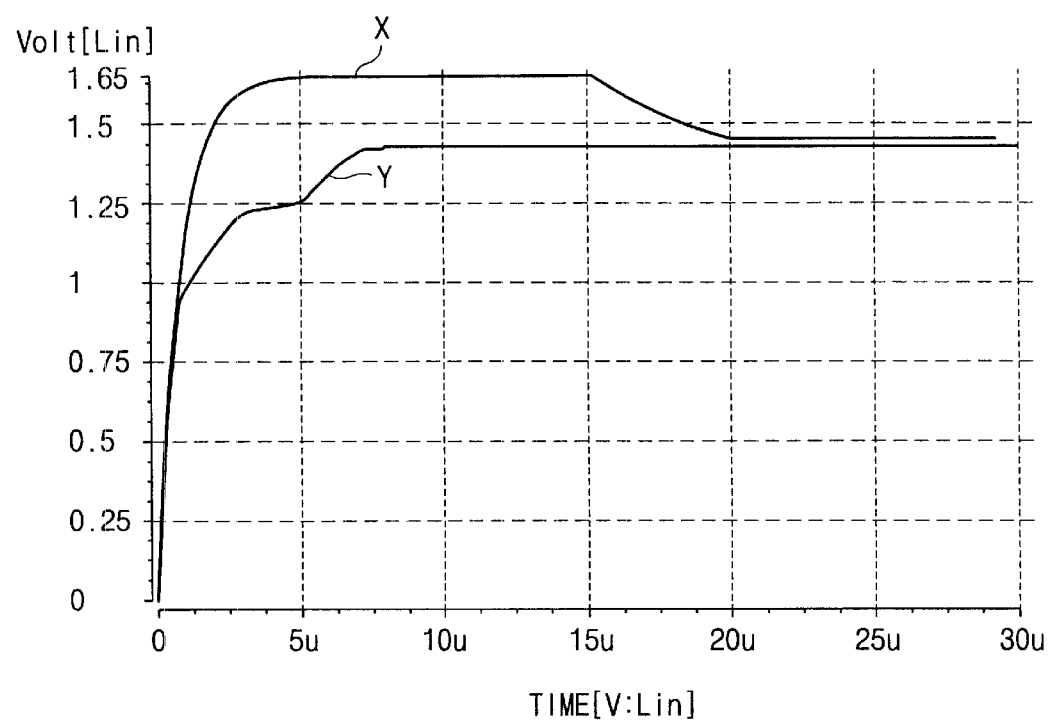
FIG. 10 is a graph showing procedures compared with the precharge circuits of FIGS. 3 and 4.

FIG. 10 is a graph showing voltage levels of embodiments of the precharge circuits of FIGS. 3 and 4. The 'X' and the 'Y' denote voltage levels supplied to the loop filter 130 by the precharge circuit 230 and by the precharge circuit 270 of FIG. 4, respectively. In the precharge circuit 230 of FIG. 3, a voltage of the second node N2 is applied to the loop filter 130 through the transmission gate 238 by a low-leveled precharge control signal PRE. After that, the PRE goes to a high level, and then a voltage from the charge pump circuit 210 is provided to the loop filter 130 through the transmission gate 236. If the phase of the input clock signal $F_{CLK}$ is later than that of the feedback signal $F_{FD}$, a voltage, which is lower than the voltage level of the N2 precharged by the first down-counting signal DN1, is provided to the loop filter 130.

In the precharge circuit 270 of FIG. 4, when the loop filter 130 is charged, an output signal of the differential amplifier 288 goes from a low level to a high level. A charge or a discharge state of the charge pump circuit 210 is determined in accordance with a turn-on or off state of the transmission gate 278. As shown in FIG. 10, considering a locking time until the system is locked on a stable operating voltage after a power-up, the locking time of the precharge circuit 270 of FIG. 4 is earlier than that of the precharge circuit 230 of FIG. 3.

Figure 5:
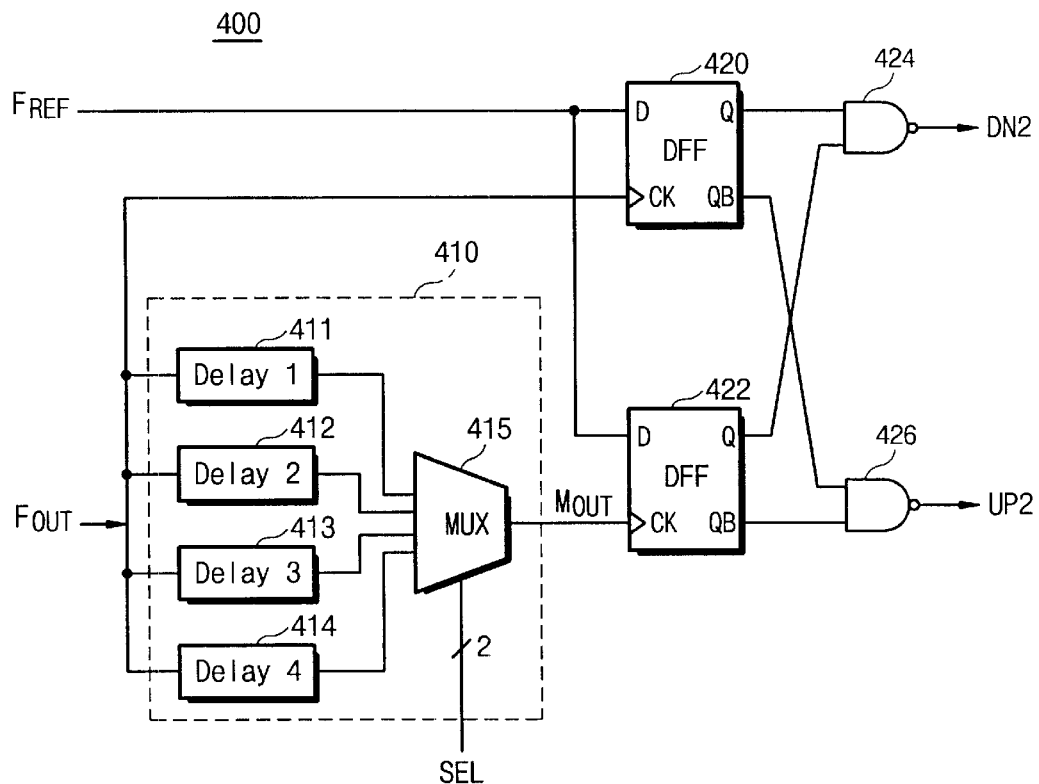
FIG. 5 is a block diagram showing a detailed configuration of one embodiment of the phase comparator of FIG. 1.

FIG. 5 is a block diagram showing a detailed configuration of the phase comparator 400 of FIG. 1. The phase comparator 400 includes a delay circuit 410, D-flip-flops 420 and 422, and NAND gates 424 and 426. The delay circuit 410 is composed of four different delay units 411–414 and a multiplexer 415. Each delay unit has a different delay time, receives the output clock signal $F_{OUT}$ from the VCDL 300, and generates a signal after the $F_{OUT}$ is delayed during an established delay time. The delay times by four delay units 411–414 correspond to the frequencies of the input clock signal $F_{CLK}$. For example, if the frequencies of the $F_{CLK}$ are A1, A2, A3, and A4 (A1>A2>A3>A4), the delay times by the delay units 411–414 are B1, B2, B3, and B4, respectively (B1<B2<B3<B4).

Among signals generated from the delay units 411–414, the multiplexer 415 selects one, and then generates a clock signal $M_{OUT}$ in response to a selection signal SEL from an external source. The clock signal $M_{OUT}$ is later than the output clock signal $F_{OUT}$ from the VCDL 300, and the selection signal SEL is based on a frequency of the reference clock signal $F_{REF}$. For example, if the frequency of the $F_{REF}$ is A1, the SEL is used to select the delay unit 411 having the B1 delay time.

The D-flip-flop 420 receives the $F_{REF}$ and synchronizes with the $F_{OUT}$ provided from the VCDL 300. The D-flip-flop 422 receives the $F_{REF}$ and synchronizes with the clock signal $M_{OUT}$ from the multiplexer 415.

The NAND gate 424 generates the second down-counting signal DN2 in response to signals generated from non-inverted output terminals Q of the D-flip-flops 420 and 422. The NAND gate 426 generates the second up-counting signal UP2 in response to signals from inverted output terminals QB of the D-flip-flops 420 and 422.

Figure 6:
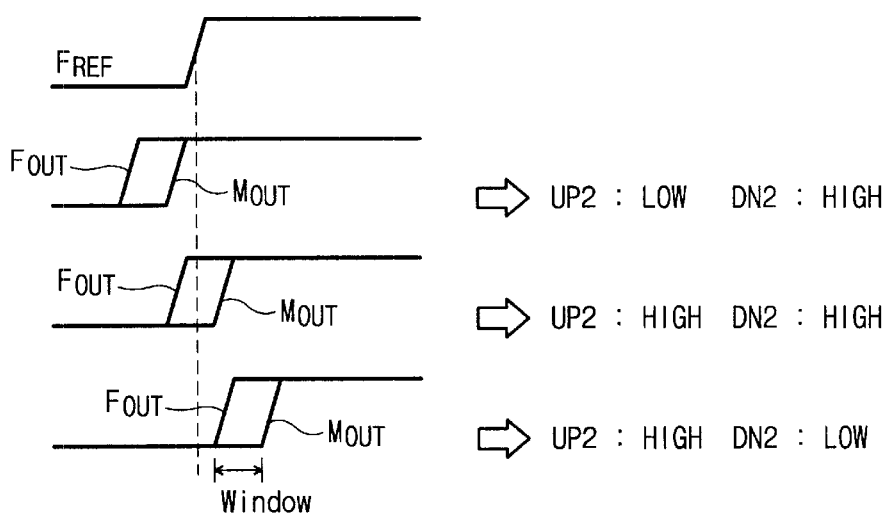
FIG. 6 is a diagram showing states of a second up-counting signal and a second down-counting signal provided from a phase comparator of FIG. 5 in accordance with an output clock signal from a voltage controlled delay line and a reference clock signal.

FIG. 6 is a diagram showing states of the second up-counting signal UP2 and the second down-counting signal DN2 from the phase comparator of FIG. 5 in accordance with the output clock signal $F_{OUT}$ from the VCDL 300 and the reference clock signal $F_{REF}$. In FIGS. 5 and 6, the "window" is a time period between when the $F_{OUT}$ from the VCDL 300 goes from a low level to a high level and when the $M_{OUT}$ from the multiplexer 415 goes from a low level to a high level. For example, in case that the input clock signal $F_{CLK}$ has a frequency from 10 MHz to 320 MHz, a range of the window is from 500 ps to 1.5 ns.

States of the second up-counting signal UP2 and the second down-counting signal DN2 from the NAND gates 424 and 426 are determined according to a point of time that the reference clock signal $F_{REF}$ goes from a low level to a high level, i.e., whether the point of time is later than an end of the window, within the window, or earlier than a beginning of the window.

First, when the point of time is later than the end of the window, the second up-counting signal UP2 from the NAND gate 424 goes to a low level and the second down-counting signal DN2 from the NAND gate 426 goes to a high level. Second, when the point of time is within the window, all of the UP2 from the NAND gate 424 and the DN2 from the NAND gate 426 go to high levels. Finally, when the point of time is earlier than the beginning of the window, the UP2 from the NAND gate 424 goes to a high level and the DN2 from the NAND gate 426 goes to a low level.

In FIG. 1, the counter 500 as a 6-bit counter operates in accordance with the UP2 and the DN2 from the NAND gates 424 and 426 of the phase comparator 400. That is, when the UP2 is a high level, the counter 500 counts up by one bit and when the DN2 is a high level, the counter counts down by one bit. However, when the UP2 and DN2 are both high levels, the counter does not operate.

The decoder 600 receives 6-bit counting signals CNT[5:0] from the counter 500 and generates third switching control signals SW3[0:63]. For example, among 64-bit of the third switching control signals SW3 [0:63] generated from the decoder 600, only one bit is state '1' and other 63-bit are state '0'.

Figure 7:
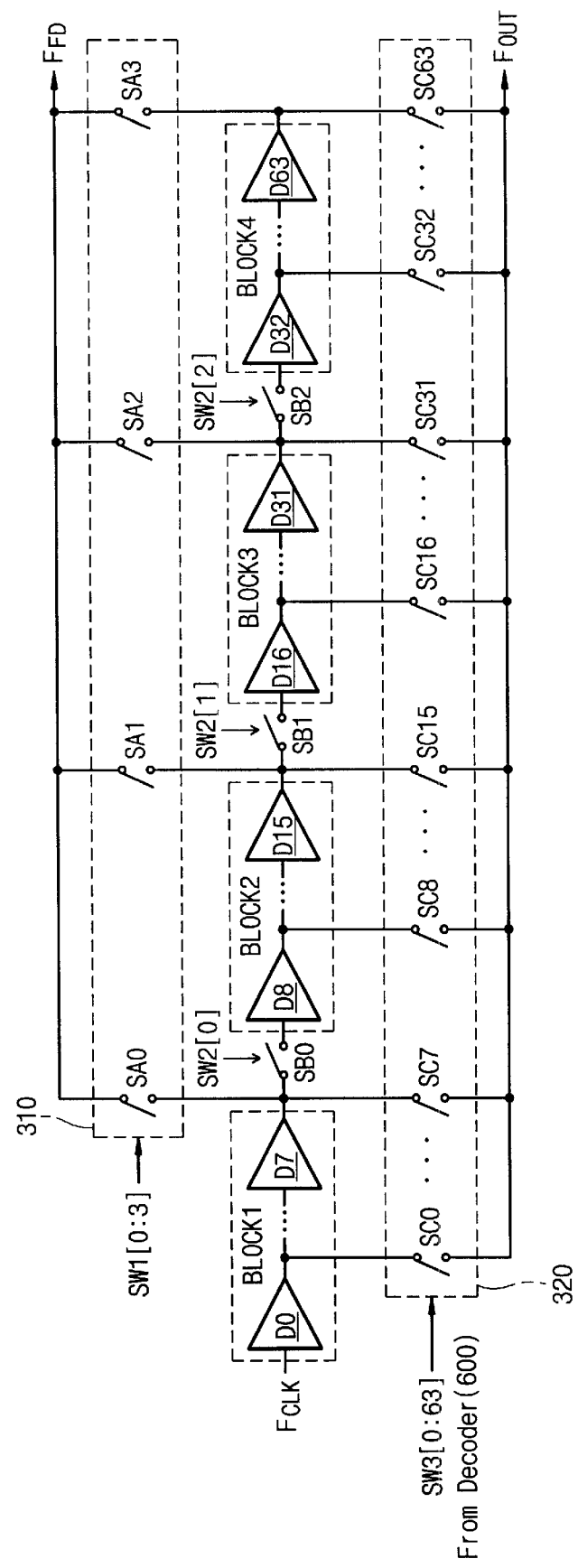
FIG. 7 is a detailed circuit diagram showing one embodiment of the voltage controlled delay line of FIG. 1.

FIG. 7 is a detailed circuit diagram showing a voltage controlled delay line VCDL 300 of FIG. 1. The VCDL 300 includes 64 delay stages D0–D63, a first switch array 310, three switches SB0–SB2, and a third switch array 320. The delay stages D0–D63 are divided into four blocks BLOCK1–BLOCK4, and are connected to each other in series. The BLOCK1–BLOCK4 are composed of delay stages D0–D7, D8–D15, D16–D31, and D32–D63, respectively, and connected by the switches SB0, SB1, and SB2. The SB0, SB1, and SB2 are controlled by bits corresponding to second switching control signals SW2[0:2] from external sources.

The first switch array 310 receives one of output signals from the BLOCK1–BLOCK4, and generates the feedback signal $F_{FD}$ in response to first switching control signals SW1 [0:3] from external sources. One of the BLOCK1–BLOCK4 is selected to generate the $F_{FD}$ in accordance with a frequency of the input clock signal $F_{CLK}$. For example, in case that frequencies of the $F_{CLK}$ are A1, A2, A3, and A4 MHz (A1>A2>A3>A4), table 1 shows switches SA0–SA3 of the first switch array 310, switches turned on among switches SB0–SB2, and selected block.

TABLE 1

| Frequency | Switch on | Selected block |
| --- | --- | --- |
| A1 | SA0 | BLOCK1 |
| A2 | SA1, SB0 | BLOCK2 |
| A3 | SA2, SB0, SB1 | BLOCK3 |
| A4 | SA3, SB0, SB1, SB2 | BLOCK4 |

The third switch array 320 consists of 64 switches SC0–SC63 to be used for generating the output clock signal $F_{OUT}$ of the VCDL 300 in response to one of output signals of the delay stages D0–D63. The switches SC0–SC63 are controlled by bits corresponding to the third switching control signals SW3[0:63] from the decoder 600. Namely, only one switch is turned on corresponding to an activated bit of state '1' of the third switching control signals SW3 [0:63], and other 63 switches are turned off. Accordingly, a signal from the delay stage corresponding to an activated bit of SW3[0:63] is provided as the output clock signal $F_{OUT}$ of VCDL 300.

For instance, in case that frequency of the input clock signal $F_{CLK}$ is 10 MHz, if the switch SA3 of the first switch array 310 and switches SB0–SB2 are all turned on, all of 64 delay stages of the VCDL 300 are connected in series. The analog phase comparator circuit 100 (FIG. 1) operates until a phase of the $F_{CLK}$ and a phase of the $F_{FD}$ from 63rd delay stage are identical with each other. Each signal from the delay stages D0–D63 has the same frequency with the $F_{CLK}$. Phases of each signal differ from each other slightly. If the phase of the $F_{CLK}$ is coincided with the phase of the $F_{FD}$ from 63rd delay stage, the phase comparator 400, the counter 500, and decoder 600 start operation. If the 20th switch SC20 of the third switch array 320 is turned on, a signal from the 20th delay state D20 is generated as the output clock signal $F_{OUT}$, and provided to the phase comparator 400 (FIG. 1). If a phase of the reference clock signal $F_{REF}$ is earlier than that of the $F_{OUT}$, a counting data of the counter 500 is increased by one bit.

Among the third switching control signals SW3[0:63] from decoder 600, 21st bit goes to a high level and other bits go to a low level, and thereby an output signal from the 21st delay stage D21 is provided as the output clock signal $F_{OUT}$. The above operation is repeatedly carried out until the phase of reference clock signal $F_{REF}$ is coincided with the phase of the $F_{OUT}$. Therefore, the input clock signal $F_{CLK}$ is synchronized with the reference clock signal $F_{REF}$.

For another example, in case that the frequency of the input clock signal $F_{CLK}$ is 320 MHz, if the switch SA0 of switches SA0–SA3 in the first switch array 310 and switches SB0–SB2 are all turned off, among the 64 delay stages D0–D63 in the VCDL 300, only 8 delay stages D0–D7 are connected in series. The analog phase comparator circuit 100 compares with phases until the phase of the input clock signal $F_{CLK}$ is coincided with the phase of the feedback signal $F_{FD}$ generated from 7th delay stage D7. If the phases become identical with each other, the phase comparator 400, the counter 500, and the decoder start operation. The range of a counting data from the counter 500 is from '0' to '7'. Namely, one of signals from the delay stages D0–D7 can be provided as the output clock signal $F_{OUT}$.

In FIG. 5, a total delay time (delay times by delay stages+delay time by multiplexer=length of window) in a delay circuit 410 of the phase comparator 400 must be longer than a delay time by one delay stage and must be shorter than delay times by two delay stages. That is because the output clock signal $F_{OUT}$ is generated late or early by the delay time by one delay stage whenever each one cycle of comparing operation is carried out. Therefore, during the repeated comparing operation, the reference clock signal $F_{REF}$ is within the window at least more than one time.

Figure 8:
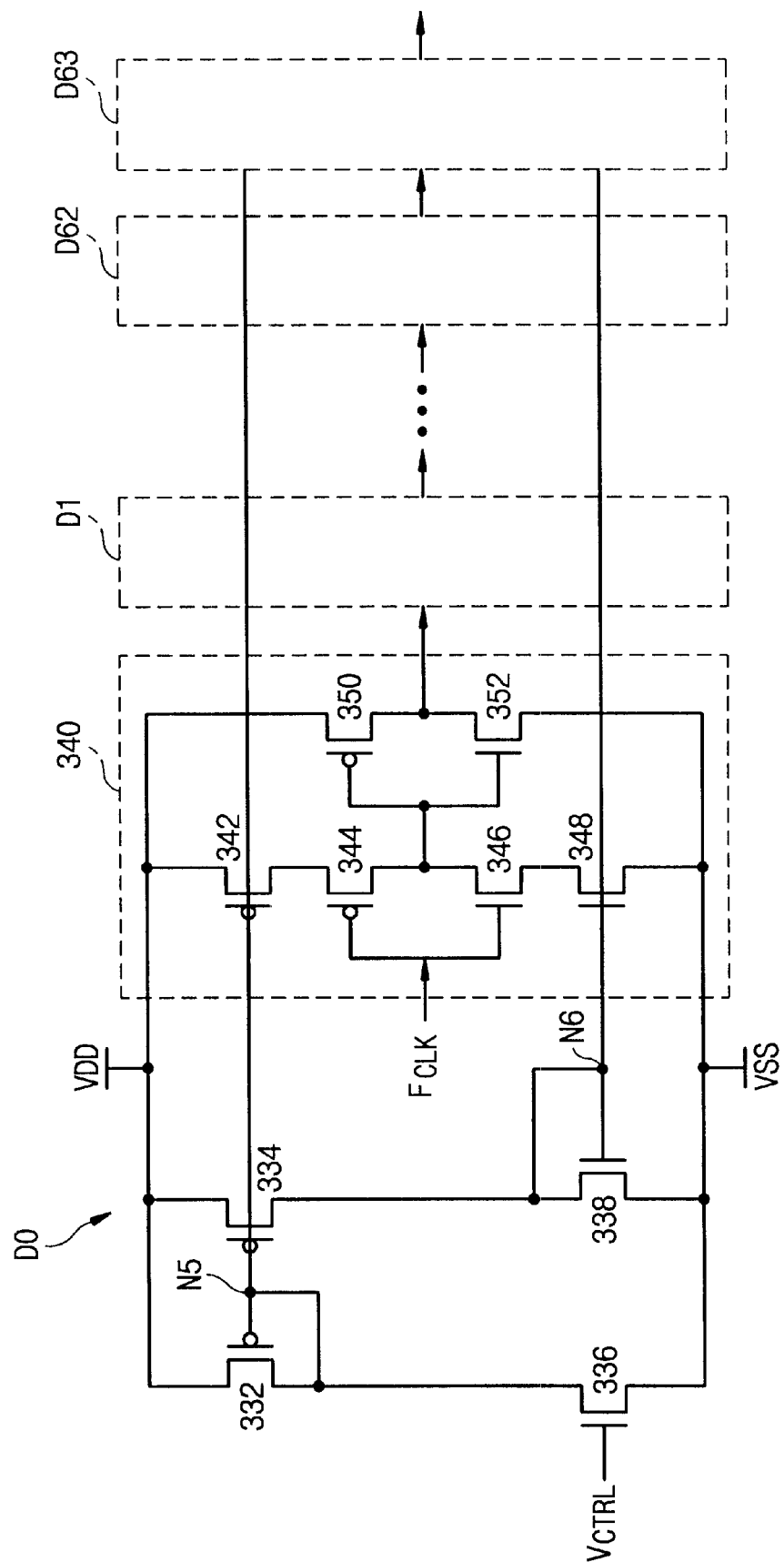
FIG. 8 is a detailed circuit diagram showing a first delay stage shown FIG. 7.

FIG. 8 is a detailed circuit diagram showing the first delay stage of FIG. 7. The delay stage D0 using a current mirror type includes PMOS transistors 332, 334, 342, 344, and 350 and NMOS transistors 336, 338, 346, 348, and 352.

The control voltage $V_{CTRL}$ from a loop filter 130 controls a gate of the NMOS transistor 336. When the $V_{CTRL}$ becomes higher, a potential of a fifth node N5 as a common gate terminal of the PMOS transistors 332 and 334 is lower than before, and then a potential of a sixth node N6 as a common gate terminal of the NMOS transistors 338 and 348 is higher than before. Thus, due to an increase of current amount through PMOS transistor 342 and NMOS transistor 348 according to the input clock signal $F_{CLK}$, a required time that the output clock signal $F_{OUT}$ is generated in response to the $F_{CLK}$ becomes shorter. That is, a delay time by the delay stages is shorter. On the contrary, if the control voltage $V_{CTRL}$ from the loop filter 130 becomes low, the delay time by the delay stages is increased.

Other delay stages D1–D63 in FIG. 7 have the same configuration as block 340 in FIG. 8 of the delay stage D0. All of delay stages D1–D63 have a same delay time corresponding to the control voltage $V_{CTRL}$. For example, in case that the input clock signal $F_{CLK}$ has a frequency ranging from 10 MHz to 320 MHz, the delay time by the delay stages is 0.39 ns to 1.3 ns. If the frequency of the F is 320 MHz, a phase margin is less than 0.39 ns.

Figure 9A:
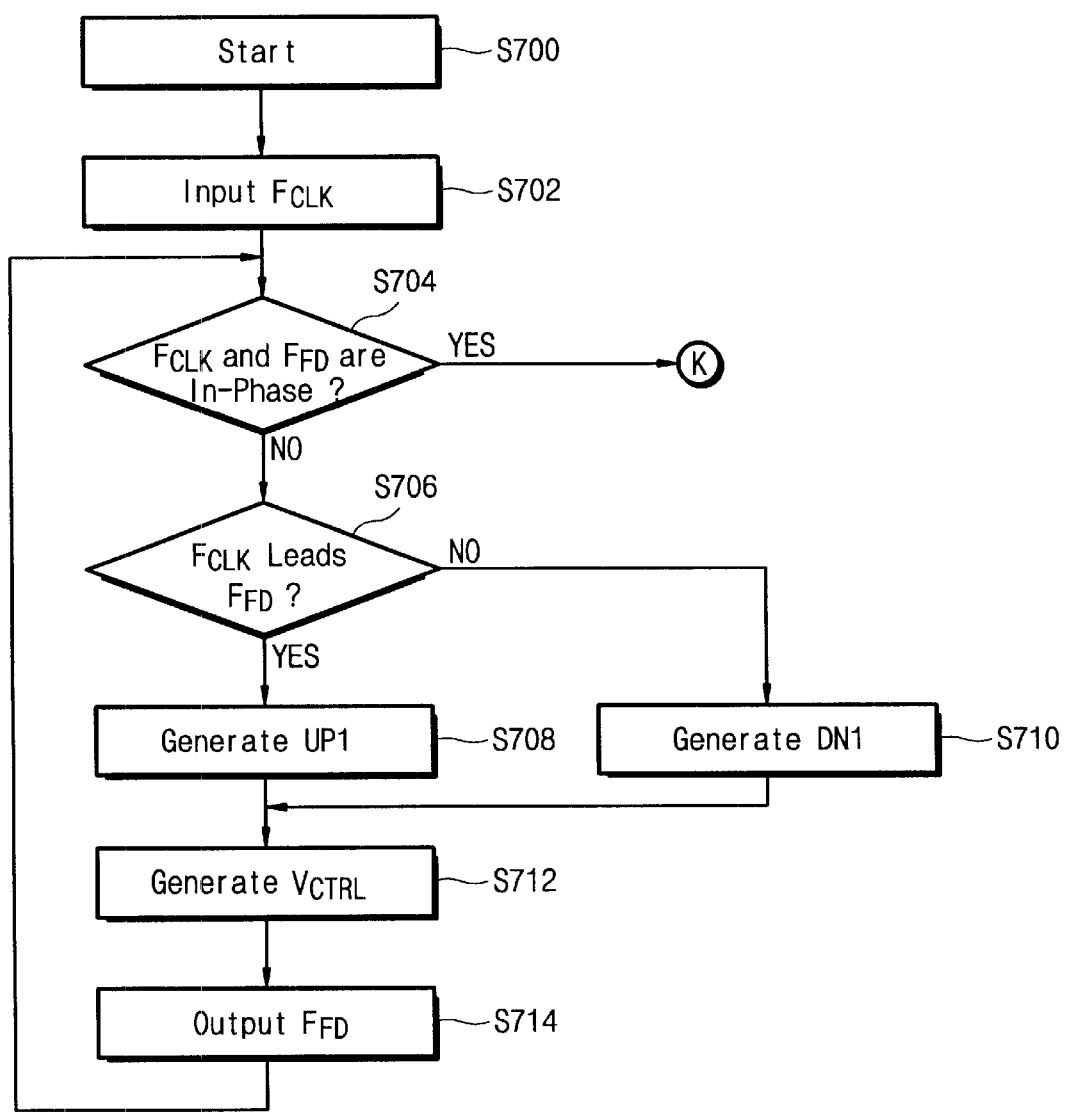
FIGS. 9A and 9B are flow charts showing sequential procedures of the PLL circuit of FIG. 1.
Figure 9B:
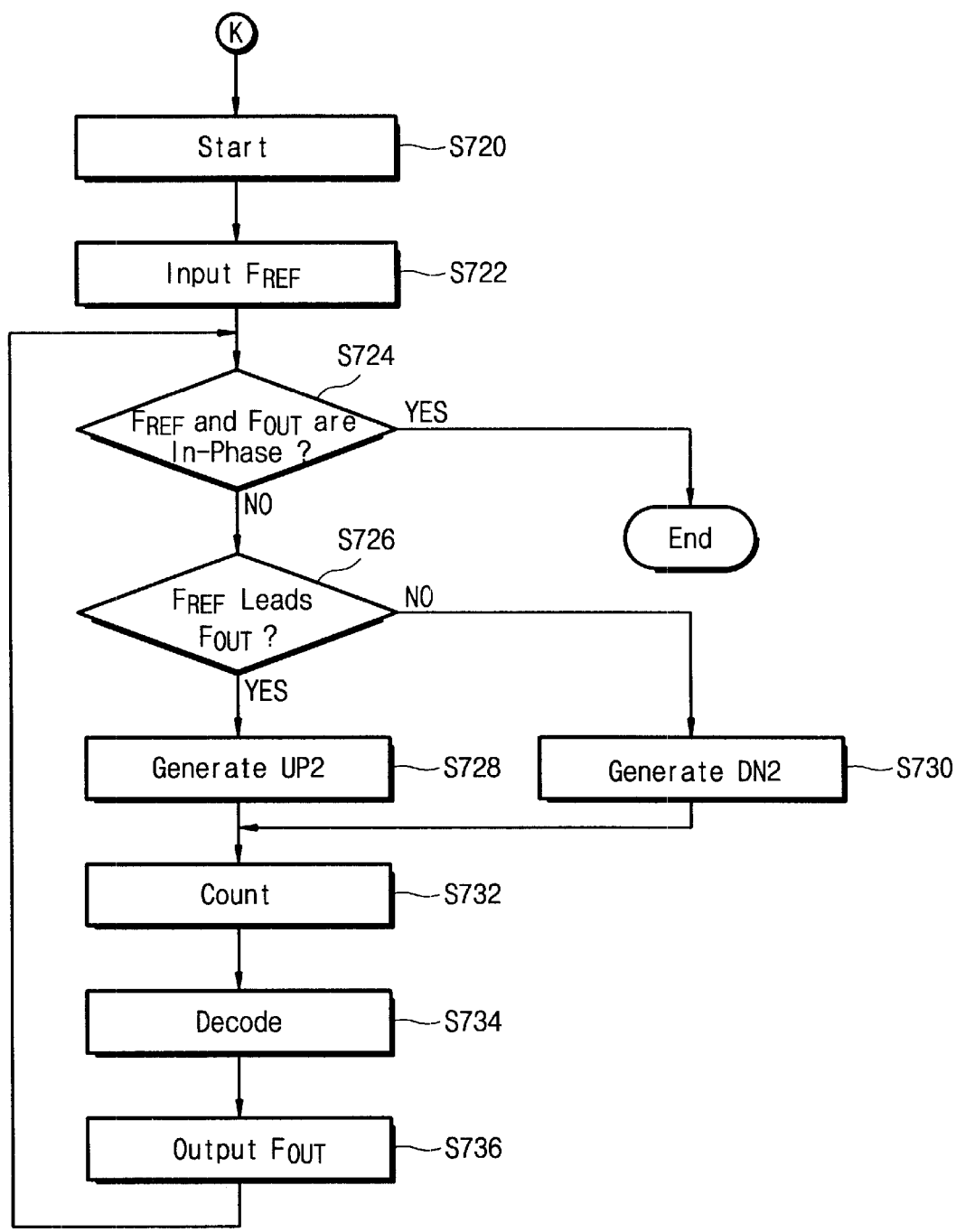

FIGS. 9A and 9B are flowcharts showing sequential procedures of the PLL circuit 10 in FIG. 1. The analog phase comparator circuit 100 and the VCDL 300 delay the input clock signal $F_{CLK}$, and generate the output clock signal $F_{OUT}$ in accordance with the control voltage $V_{CTRL}$ corresponding to a phase difference between the $F_{CLK}$ and the $F_{FD}$. As the above, an operation of the analog phase comparator circuit 100 and VCDL 300 is an analog delay-locked loop (DLL). Meanwhile, the phase comparator 400, the counter 500, the decoder 600, and the VCDL 300 receive the input clock signal $F_{CLK}$ delayed by a counting data CNT[0:5] corresponding to a phase difference between the reference clock signal $F_{REF}$ and the output clock signal $F_{OUT}$. As the above, an operation of the phase comparator 400, the counter 500, the decoder 600, and the VCDL 300 is a digital delay-locked loop (hereinafter refer to digital DLL).

FIGS. 1 and 9A illustrate the analog DLL operation. If the analog DLL begins operation, the input clock signal $F_{CLK}$ is provided to the phase/frequency detector 110 and the VCDL 300 (step S702).

In step S704, the phase/frequency detector 110 compares the phase of the $F_{CLK}$ with that of the feedback signal $F_{FD}$ generated from the VCDL 300 and examines whether the phases coincide with each other. As the result, if the phases do not coincide, step S706 is performed.

In the S706 step, the phase/frequency detector 110 examines whether the phase of the $F_{CLK}$ leads that of the $F_{FD}$ from the VCDL 300. As the result, if the phase of the $F_{CLK}$ leads that of the $F_{FD}$, the phase/frequency detector 110 generates the first up-counting signal UP1 (step S708), and if the phase of the $F_{CLK}$ is later than that of the $F_{FD}$, the phase/frequency detector 110 generates the first down-counting signal DN1 (S710 step).

In step S712, the charge pump 120 and the loop filter 130 generate the control voltage $V_{CTRL}$ in response to the UP1 and the DN1 from the phase/frequency detector 110.

In step S714, while the $V_{CTRL}$ is applied, the VCDL 300 delays the input clock signal $F_{CLK}$, and then generates the feedback signal $F_{FD}$.

Returning to step S704, if the phases of the $F_{CLK}$ and $F_{FD}$ are coincided with each other, step S720 begins and the digital DLL operation starts.

FIGS. 1 and 9B explain the digital DLL operation. When the digital DLL operation starts, the reference clock signal $F_{REF}$ is provided to the phase comparator 400.

In step S724, the phase comparator 400 examines whether phases of the reference clock signal $F_{REF}$ and the output clock signal $F_{OUT}$ from the VCDL 300 are identical with each other. Coincidence of phases between the $F_{REF}$ and the $F_{OUT}$ is informed of, as shown in FIG. 6, a point of time that transition of the $F_{REF}$ from a low level to a high level is within the window. If the phases of the $F_{REF}$ and $F_{OUT}$ are not identical with each other, step S726 is performed. In the S726 step, the phase comparator 400 examines whether phase of the $F_{REF}$ is earlier than that of the $F_{OUT}$ from the VCDL 300. As the result, if the phase of the $F_{REF}$ is earlier than that of the $F_{OUT}$, the phase comparator 400 generates a second up-counting signal UP2 (step S728). On the contrary, if the phase of the $F_{REF}$ is later than that of the $F_{OUT}$, the phase comparator 400 generates a second down-counting signal DN2 (steo S730).

In step S732, the counter 500 counts up or down in response to the UP2 and the DN2 from the phase of comparator 400. In step S734, the decoder 600 generates 64-bit third switching control signals SW3[0:63] using 6-bit counting signals CNT[0:5] generated from the counter 500. Among the 64-bit of the third switching control signals SW3[0:63] generated from the decoder 600, only one bit is state '1' and other 63-bit are state '0'. In step S736, the VCDL 300 generates the output clock signal $F_{OUT}$ in response to a signal generated from the delay stage corresponding to the activated bit of the third switching control signals SW3[0:63] from the decoder 600. Then, returning to the S724 step, the digital DLL is repeatedly operated.

In step S724, when the phases of the reference clock signal $F_{REF}$ and the output clock signal $F_{OUT}$ are coincided with each other, the digital DLL operation is completed.

Figure 11A:
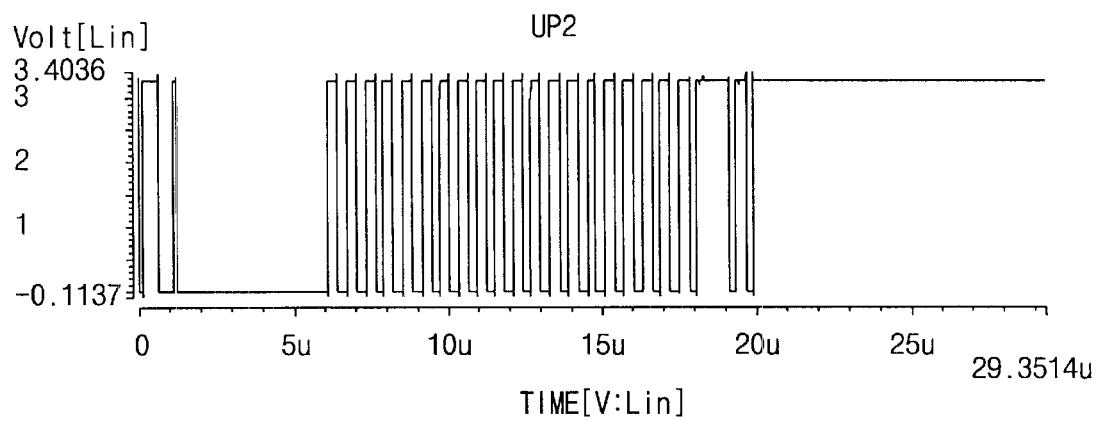
FIGS. 11A and 11B are graphs showing second up-counting and down-counting signals from a counter when the PLL circuit according to a preferred embodiment of the present invention is simulated by HSPICE.
Figure 11B:
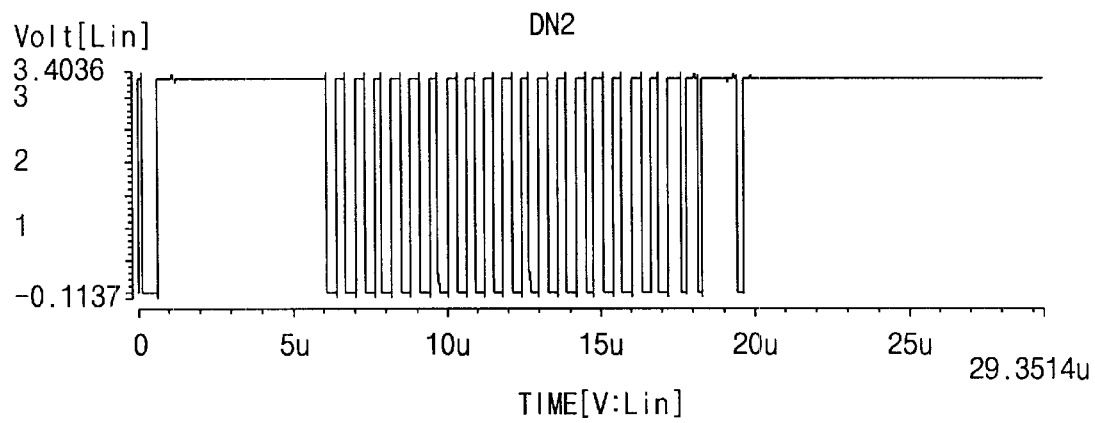

FIGS. 11A and 11B are graphs showing the second up-counting signal UP2 and the second down-counting signal DN2 provided from the counter 500 when the PLL circuit is simulated by HSPICE according to a preferred embodiment of the present invention. When the phases of the input clock signal $F_{CLK}$ and the reference clock signal $F_{REF}$ are not identical with each other, the UP2 and the DN2 are high and low levels, respectively, and then when the phases are identical, both of the UP2 and the DN2 are fixed to high levels.

Figure 12A:
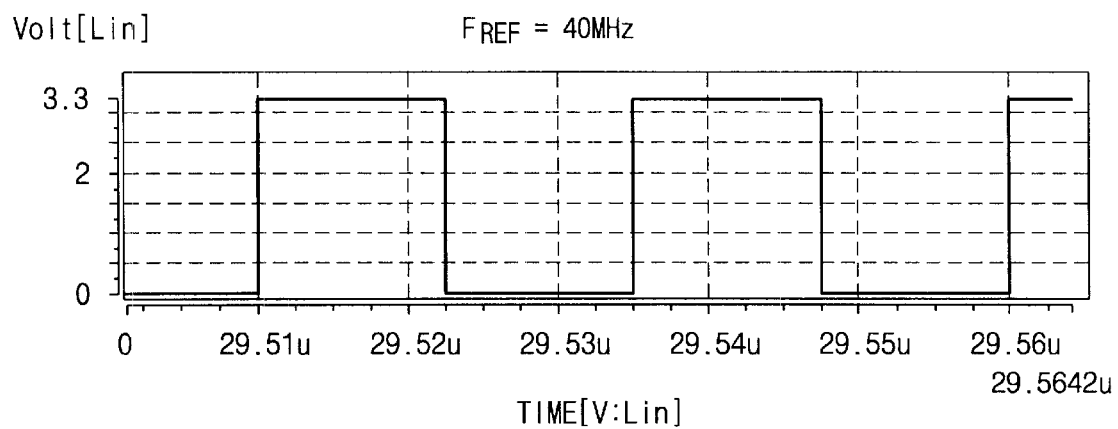
FIG. 12A is a graph showing a reference clock signal at 40 MHz.
Figure 12B:
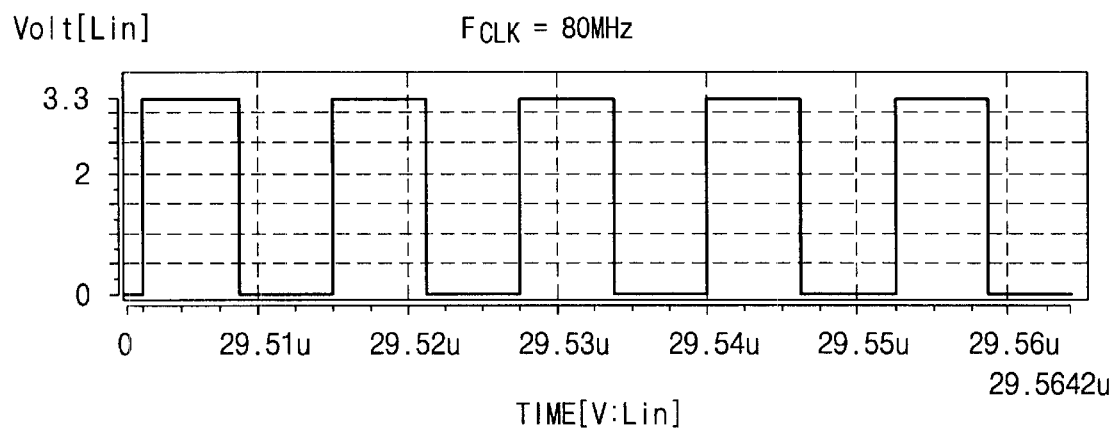
FIG. 12B is a graph showing an input clock signal at 80 MHz.
Figure 12C:
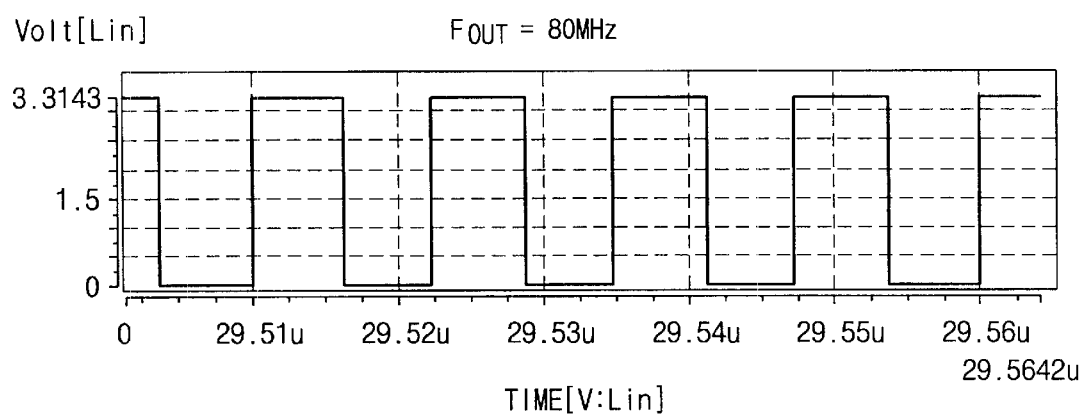
FIG. 12C is a graph showing an output clock signal from the voltage controlled delay line.

FIG. 12A is a graph showing the reference clock signal $F_{REF}$ having a frequency of 40 MHz and FIG. 12B shows the input clock signal $F_{CLK}$ having a frequency of 80 MHz. FIG. 12C shows that the $F_{CLK}$ of FIG. 12B is synchronized with the $F_{REF}$ of FIG. 12A.

As shown in FIG. 12A to 12C, the output clock signal $F_{OUT}$ generated from the VCDL 300 has the same frequency with the input clock signal $F_{CLK}$ and is synchronized with the reference clock signal $F_{REF}$.

While the present invention has been described reference to preferred embodiments, numerous modifications and variations of the invention will be apparent to one of skill in the art without departing from the scope of the invention. According to the present invention, phases of the first clock signal and the reference clock signals with different frequencies may be synchronized with each other. Moreover, the phase-locked loop (PLL) circuit of the present invention can be applied to various fields for a wide frequency range of the input clock signal.

What is claimed is:

1. A phase-locked loop (PLL) circuit for synchronizing frequencies of a first clock signal and a second clock signal, comprising:
    a first phase comparator circuit for comparing phases of a first clock signal having the first frequency and a feedback signal and for generating a control voltage corresponding to a phase difference between said first clock signal and said feedback signal, the first frequency being one of a quantity M of frequencies, where M is a positive integer;
    a second phase comparator circuit for comparing phases of the second clock signal having a second frequency and an output clock signal and for generating a differential signal indicative of a phase difference between said second clock signal and said output clock signal;
    a counter for counting data in response to the differential signal of said second phase comparator, the data having a maximum value controlled by the first frequency of the first clock signal;
    a decoder for decoding N-bit switching control signals from said data of said counter; and
    a voltage controlled delay line for generating said feedback signal in response to said first clock signal after said first clock signal is delayed while said control voltage is applied to a voltage controlled delay line;
    wherein said voltage controlled delay line includes N delay stages, which are connected in series corresponding to each bit of said N-bit switching control signals, and generates said output clock signal in response to a signal from a delay stage corresponding to said switching control signals.

2. A phase-locked loop (PLL) circuit according to claim 1, wherein said delay stages are divided into M blocks;
    said voltage controlled delay line comprising:
    a quantity (M−1) of first switches to be controlled by one of the switching control signals of the N-bit switching control signals, said one of the switching control signals corresponding to the frequency of said first clock signal, said first switches connecting said blocks; and
    an array of M second switches to be controlled by another of the switching control signal of the N-bit switching control signals, said other switching control signal corresponding to the frequency of said first clock signal, said second switches generating said feedback signal in response to a signal of a block corresponding to the frequency of said first clock signal.

3. A phase-locked loop (PLL) circuit according to claim 1, wherein said voltage controlled delay line includes an array of N switches to be controlled by a bit corresponding to said N-bit switching control signals and to generate said output clock signal in response to a signal from one of the N delay stages.

4. A phase-locked loop (PLL) circuit according to claim 1, wherein among said N-bit switching control signals, only one bit corresponding to said counting data is activated.

5. A phase-locked loop (PLL) circuit according to claim 3, wherein a switch of the array of N switches is turned on by an activated bit of said N-bit switching control signals, and a signal from one of the N delay stages corresponding to the switch of the array of N switches that is turned on is generated as said output clock signal.

6. A phase-locked loop (PLL) circuit according to claim 1, wherein said first phase comparator circuit includes:
- a phase/frequency detector for comparing phases of said first clock signal and said feedback signal and for generating a second differential signal indicative of a phase difference between said first clock signal and said feedback signal;
- a charge pump for generating a charge pump signal corresponding to said second differential signal; and
- a loop filter for generating said control voltage corresponding to said charge pump signal.

7. A phase-locked loop (PLL) circuit according to claim 6, wherein said loop filter includes a capacitor having a first end connected to an output terminal of said charge pump and having a second end connected to a ground voltage.

8. A phase-locked loop (PLL) circuit according to claim 7, wherein said charge pump includes a precharge circuit for precharging said capacitor upon a power-up.

9. A phase-locked loop (PLL) circuit according to claim 8, wherein said precharge circuit includes:
- a first circuit for generating a precharge voltage of a predetermined level; and
- a second circuit for providing a charge pump signal generated from one of said precharge voltage and said charge pump to said capacitor in response to an externally applied precharge signal.

10. A phase-locked loop (PLL) circuit according to claim 8, wherein said precharge circuit includes:
- a first circuit for generating a first voltage at a first voltage level;
- a second circuit for generating a second voltage at a second voltage level which is lower than said first voltage level;
- a differential amplifier for generating a difference between a voltage of said capacitor and said second voltage level; and
- a third circuit for providing to said capacitor a precharge signal generated from one of said first voltage at a first voltage level and said charge pump, in response to a signal from said differential amplifier.

11. A phase-locked loop (PLL) circuit according to claim 1, wherein said second phase comparator circuit includes:
- delay units for delaying said output clock signal during a predetermined time;
- a fist latch for synchronizing said second clock signal with said output clock signal;
- a second latch for synchronizing said second clock signal with a signal generated from said delay units; and
- a logic circuit for generating an up-counting signal and a down-counting signal in response to signals from said first and second latches.

12. A phase-locked loop (PLL) circuit according to claim 11, wherein said counter counts data up and down by one bit in response to said up-counting and down-counting signals, respectively.

13. A phase-locked loop (PLL) circuit according to claim 11, wherein said delay units generate said output signal by delaying for a predetermined time corresponding to the frequency of said first clock signal.

14. A phase-locked loop (PLL) circuit according to claim 13, wherein said delay units include:
- a quantity M of delay stages for providing said output signal by delaying during different delay times; and
- a multiplexer for generating an output signal from one of said delay stages in response to a selecting signal corresponding to a current frequency of said first clock signal.

15. A phase-locked loop (PLL) circuit according to claim 14, wherein said output clock signal is delayed in said delay units, the total delay time of said output clock signal being longer than a delay time of one of said delay stages and being shorter than delay times of two of said delay stages.

16. A phase-locked loop (PLL) circuit according to claim 11, wherein said first and second latches comprise D-flip-flops.

17. A phase-locked loop (PLL) circuit according to claim 11, wherein said logic circuit includes:
- a first NAND gate for generating said up-counting signals in response to signals from said first and second latches; and
- a second NAND gate for generating said down-counting signals in response to inverted signals from said first and second latches.

18. A method for synchronizing a first clock signal having a first frequency with a second clock signal having a second frequency comprising:
- (a) generating an output clock signal which is delayed with respect to said first clock signal by one cycle by delaying said first clock signal;
- (b) comparing phases of said output clock signal and said second clock signal;
- (c) generating a differential signal when the phases of said output clock signal and said second clock signal are not identical with each other;
- (d) selectively incrementing or decrementing counted data in response to said differential signal;
- (e) decoding said counted data to generate control signals; and
- (f) adjusting the output clock signal to be synchronized with the second clock signal by delaying said first clock signal while said control signals are activated;
- wherein steps (a) and (b) are repeatedly performed until the phases of said output clock signal and said second clock signal are identical to each other, such that the output clock signal is synchronized with the second clock signal.

19. A method according to claim 18, wherein step (a) comprises:
- (a1) receiving said first clock signal;
- (a2) generating a feedback signal by delaying said first clock signal;
- (a3) comparing phases of said first clock signal and said feedback signal;
- (a4) generating a differential signal when the phases of said first clock signal and said feedback signal are not identical with each other; and
- (a5) generating a control voltage corresponding to said differential signal;
- wherein:
- the feedback signal is generated in step (a5) by delaying said first clock signal while said control voltage is applied; and
- steps (a1) through (a5) are repeatedly performed until the phases of said first clock signal and said feedback signal are identical to each other.

* * * * *